(12) United States Patent
Jung et al.

(10) Patent No.: US 6,433,369 B2
(45) Date of Patent: Aug. 13, 2002

(54) SOLID STATE IMAGING DEVICE FOR ACHIEVING ENHANCED ZOOMING CHARACTERISTICS AND METHOD OF MAKING THE SAME

(75) Inventors: Sang-Il Jung; Jun-Taek Lee, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/862,425

(22) Filed: May 23, 2001

(30) Foreign Application Priority Data

May 23, 2000 (KR) .......................................... 2000-27810

(51) Int. Cl.[7] ............................................ H01L 27/148
(52) U.S. Cl. ........................ 257/215; 257/223; 257/230
(58) Field of Search ................................... 257/215, 223, 257/230, 233, 236, 249, 368; 438/69, 75, 121

(56) References Cited

U.S. PATENT DOCUMENTS

| | | | | | |
|---|---|---|---|---|---|
| 5,349,216 A | * | 9/1994 | Lee et al. | .................... | 257/223 |
| 5,619,049 A | * | 4/1997 | Kim | ............................. | 257/223 |
| 5,760,430 A | * | 6/1998 | Kato | ............................ | 257/231 |
| 6,143,585 A | * | 11/2000 | Hatano et al. | ............... | 257/229 |
| 6,198,138 B1 | * | 3/2001 | HIrota | ......................... | 257/368 |

* cited by examiner

Primary Examiner—David Nelms
Assistant Examiner—Dao H Nguyen
(74) Attorney, Agent, or Firm—Volentine Francos, PLLC

(57) ABSTRACT

A barrier area is located adjacent a horizontal transfer area and spaced from a field insulating area. The barrier area includes an insulating layer and a conductor extending from the horizontal transfer layer over the surface of a semiconductor substrate, a barrier layer of a second conductivity type formed under the surface of the semiconductor substrate and adjacent a first impurity layer of a first conductivity type of the horizontal transfer area, and a second impurity layer extending from the horizontal transfer area and formed under the barrier layer. A discharge area is located between the barrier area and the field insulating area. The discharge area includes a field insulating layer interposed between the insulating layer and the conductor extending from the barrier layer over the surface of the semiconductor substrate, and a discharge layer of the first conductivity type formed under the surface of the semiconductor substrate and adjacent the barrier layer of the barrier area over the surface layer. An impurity concentration of the discharge layer is greater than that of the first impurity layer.

6 Claims, 15 Drawing Sheets

SOLID STATE IMAGING DEVICE FOR ACHIEVING ENHANCED ZOOMING CHARACTERISTICS AND METHOD OF MAKING THE SAME

BACKGROUND OF THE INVENTION

1. Field of the Invention

The present invention generally relates to solid state imaging devices equipped with charge coupled devices (CCD's) and, more particularly, the present invention relates to solid state imaging devices which are configured for electronic zooming and to methods of fabricating such devices.

Priority is claimed to Korean patent application No. 2000-27810, filed May 23, 2000, the contents of which are incorporated herein in their entirety.

2. Description of the Related Art

Generally, solid state imaging devices are semiconductor devices which sense external images and convert the thus sensed images into image signals. Images are typically captured through lenses and converted into image signals on a pixel by pixel basis. These image pixel signals are then amplified for visual reconstruction on a television or other display apparatus.

FIG. 1 illustrates the basic construction of a solid state imaging device. This diagram depicts a top view of the device, which is typically contained in a active area of a semiconductor substrate that is rectangular and defined by a surrounding field insulating region (not shown). Light receiving parts 10 are arranged in a matrix as shown and include respective photodiodess. Vertical transfer stages 20 extend parallel to each other in a column direction and are arranged between columns the light receiving parts 10. The vertical transfer stages 20 are commonly coupled at one end to a horizontal transfer stage 30 that extends lengthwise in a direction perpendicular to the vertical transfer stages 20.

The photodiodes of the light receiving parts 10 are each configured by a P-N junction formed in the semiconductor substrate. For example, a P-type impurity diode layer is formed over a surface layer of the semiconductor substrate, and a buried N-type impurity diode layer is formed thereunder. A periphery of the N-type impurity diode layer is surrounded by the P-type impurity layers, being isolated therefrom. When a photodiode formed in a light receiving part 10 senses external light, photoelectrons are generated to condense charges. These charges are transferred to a vertical transfer stage 20 and then gradually transferred to the horizontal transfer stage 30 in response to a clock signal applied to the vertical transfer stage. The transferred charges to the horizontal transfer stage 30 are transferred to a circuit of an output unit in response to a clock signal that is rapidly applied to the horizontal transfer stage 30, thereby forming an amplified image signal.

The aforementioned clock signal is transferred to the horizontal transfer stage 30 through a gate electrode that is separated from a thin gate insulating layer. A voltage is divided into the specific steps, which are sequentially and periodically applied to the gate electrode. The gate electrode also is divided into parts that transfer charges of a predetermined width to the circuit of an output unit, forming a stepped potential thereby.

The amount of charges condensed in the light receiving parts 10 of the solid state imaging device is dependent upon an intensity or quantity of incident light. In some cases, charges which are produced in the light receiving parts 10 from a large quantity of incident light and transferred from the vertical transfer stage 20 to the horizontal transfer stage 30, are so excessive as to prevent the proper transfer of charges from the horizontal transfer stage to an output unit.

An example of a structure for processing excessive charges transferred to a transfer stage is disclosed in U. S. Pat. No. 4,504,848. In the disclosed structure, a drain for discharging charges of a light receiving part is formed to produce remnant charges in an established active region for forming the light receiving part. A voltage barrier region is operable with a voltage whose level is identical to that of the light receiving part, and is set between a drain region and a general light receiving part. The drain is doped with one type of impurities whose concentration is higher than that of the light receiving part, and the barrier region has additive impurities of the other type.

In such a structure, although a voltage is applied equivalently to a general light receiving part and a barrier layer, the barrier layer is influenced less than the general light receiving part by the voltage. Within a constant voltage range, a charge processing capacity in a transfer mode (wherein a voltage is applied to a gate) is higher than that in a light receiving mode (wherein the voltage is applied thereto). If the charge processing capacity is lowered at a specific position of the vertical transfer stage, a vertical error can be prevented. Here, the vertical error is a brightness decay phenomenon at a region over the specific position.

A structure for discharging remnant charges to a drain through a barrier is disclosed in U. S. Pat. No. 5,455,443. In this case, a buffer zone is formed between a drain for discharging remnant charges and a barrier region to discharge the remnant charges. The buffer zone prevents the drain from discharging the remnant charges to vertical and horizontal transfer stages resulting from transient potential instability. In other words, charges are not transferred to a position where they must normally be transferred for images, preventing distortion of a display screen.

Another type of phenomenon relating to excessive charges occurs, for example, during special functions of an image pickup apparatus. In a conventional image pickup operation, the horizontal transfer stage cannot process photoelectrons that are excessively transferred while carrying out an electronic zooming function. This causes distortion of an upper part of a screen that is zoomed in.

Referring to FIG. 2, electronic zooming functions to output only a zoom area 40 to the exclusion of a remaining area of an overall pixel area 50 of a solid state imaging device. In a zoom mode, signal line electrons of intervals A and B are transferred in a short time to a horizontal transfer stage 30 in response to a clock signal of a fast vertical transfer stage. These electrons are discarded through reset-step transfer in which a screen is not composed. Electrons of a signal line in a zoom interval are transferred to a horizontal transfer stage 30 in response to a clock signal of a vertical transfer stage that is later than a general processing. Except for electrons in a column of the zoom area 40, signal line electrons of a zoom interval are processed so that a screen is not composed by a high-frequency horizontal clock signal or other circuit arrangement. In proportion to a zoom ratio, only electrons in the zoom area 40 are processed in a circuitry section by a low-frequency clock signal to compose images of a display part.

By electrons generated and condensed in all pixels of a signal line of the A and B region in an electronic zoom mode, a large quantity of electrons rapidly transferred to the horizontal transfer stage 30 can be discharged through a reset drain of an output terminal along the stage 30. Since a quantity of inflow electrons is temporarily greater than a discharge capacity of the horizontal transfer stage 30, an effective potential of the stage 30 is rapidly lowered. As a result, a part of the electrons transferred to the stage 30 flows backwardly toward all the vertical transfer stages, as shown in a backflow area 30 of FIG. 3.

The backflow electrons are mixed with electrons of the zoom area 40. This causes a blooming phenomenon in which normal zoom images are not expressed in an upper scanning line of a display screen and the overall screen becomes bright.

FIG. 4A depicts a horizontal transfer area and an adjacent field insulation area in a conventional solid state imaging device. FIG. 5A through FIG. 5C are diagrams for describing formation of such a conventional solid state imaging device.

Referring to FIG. 5A, a thin gate insulating layer 105 is formed over a semiconductor substrate 117. On the insulating layer 105, ionized impurities are implanted to form a P-type well 111, a P-type impurity doping layer 109, a peripheral well 115, and a horizontal charge stop layer 113. Thus, a lower structure of an impurity doping layer is made.

Then, a field insulating layer 103 is stacked on an overall surface of the substrate 117 in which doping layers are formed. The field insulating layer 103 remains only in a field insulation part as the result of conventional patterning, thus distinguishing an active region from the filed insulation part.

Referring to FIG. 5B, a photoresist pattern 119 is used as an ion-implanting mask to selectively implant N-type impurities into the semiconductor substrate 117, thereby forming a transfer stage such as a horizontal transfer stage 107. Conventionally, an amount (dosage) of ionized impurities is $3\times10^{12} \sim 5\times10^{12}$ particles/cm$^2$.

Referring to FIG. 5C, a gate electrode 101 made of polysilicon is formed over the semiconductor substrate 117 in which an impurity doping has been carried out. The gate electrode 101 is vertical to a migration direction of a horizontal transfer stage 107. Conventionally, a gate electrode is classified into two groups. By way of a patterning step, one of the two groups is formed first. After implanting low-concentration impurities of $2\times10^{11} \sim 4\times10^{11}$ particle/cm$^2$ into a gate electrode of the firstly formed group, a gate electrode of the other group is formed. Gate electrodes of the secondly formed group are each partially overlapped between the firstly formed groups. A step of forming a thin insulating layer is carried out between the steps of forming the two groups of gate electrodes to thereby insulate the gate electrode groups from each other.

Turning to FIG. 4A, a thin insulating layer 105 is formed over the semiconductor substrate 117. An interface 100' is formed between a horizontal transfer area 100 and a filed insulation part 400. A filed insulating layer 103 is formed on a gate insulating layer 105 of the filed insulation part 400. A conductive layer 101 is formed on the gate insulating layer 105 from the horizontal transfer area 100 to the interface 100', and on the field insulating layer 103 from the field insulation part 400. The field insulating layer 103 increases in thickness from a boundary of the filed insulation part 400 to an external periphery at a constant rate, and then maintains a constant thickness. The conductive layer, i.e., gate electrode 101 spreads considerably over the horizontal transfer region 100 and the field insulation part 400.

An N-type impurity doping layer composing a horizontal transfer stage 107, a P-type impurity doping layer 109, and a P-type well 111 are formed under a surface layer of the semiconductor substrate 117. A horizontal charge stop layer 113 and the P-type well 111 are formed under the field insulating layer 400 and the interface 100'. The horizontal charge stop layer 113 is doped with P-type impurities. A P-type peripheral well 115 is formed at the substrate 117.

FIG. 4B illustrates the charge variation the line X—X' of FIG. 4A. The line X1 of FIG. 4B represents a potential when a voltage is not applied to a gate electrode, and line X2 of FIG. 4B represents a increased potential when a voltage is applied to a gate electrode. As shown, there is no charge carrier (i.e., construction capable of passing or receiving electrons) in an interface and a field insulation part. If transferred electrons increases in number, a horizontal transfer stage cannot process all the transferred electrons using a normal screen processing method. Remnant electrons accumulate in the horizontal transfer stage and lower an effective potential, and flow backwardly toward a vertical transfer stage. The backflow electrons are mixed with electrons which represent a zoom area image, causing a blooming phenomenon in an upper screen part.

The blooming phenomenon can be explained with reference to FIG. 6 and FIG. 4C. Steps in these diagrams denote a potential difference of each part when a gate electrode is overlapped with a horizontal transfer stage. The lower the steps, the higher their potentials. With a higher potential, electrons can rise up well.

The structures of solid state imaging devices in the previously discussed U.S. patents are directed to the prevention of problems caused by excessive electron generation in a light receiving part. These patents do not consider surplus electrons based on an image function, i.e., an electronic zooming function. In other words, the patents do not consider discharge direction or path of electrons in view of batch discharging and processing of photoelectrons generated in a predetermined area of a solid state imaging device.

Therefore, conventional structures do not overcome the blooming phenomenon that occurs in a solid state imaging device having an electronic zooming function.

SUMMARY OF THE INVENTION

It is therefore an object of the present invention to provide a solid state imaging device which can prevent a blooming phenomenon in a displayed screen even though photoelectrons generated in a light receiving part are transferred to a horizontal transfer stage in an electronic zoom mode at a same time, and to provide a method of forming the same.

It is another object of the invention to provide a solid state imaging device which can prevent a blooming phenomenon therein while performing an electronic zooming function and suppress image distortion when electrons of an area which compose images deviate from a horizontal transfer stage, and to provide a method of forming the same.

It is still another object of the invention to provide a solid state imaging device having an electronic zooming function and a structure which can easily secure a sufficient processing margin, and to provide a method of forming the same.

According to one aspect of the present invention, a charge-coupled-device (CCD) solid state imaging device includes a semiconductor substrate having a surface defined by an active area and a field insulating area, a plurality of light receiving parts arranged in a matrix of rows and columns within the active area of the surface of the semiconductor substrate, a plurality of vertical charge transfer stages which extend parallel to each other in a column direction and which are connected to adjacent respective columns of the plurality of light receiving parts, and a horizontal charge transfer stage commonly connected to ends of the plurality of vertical transfer stages and formed in a horizontal transfer area. The horizontal transfer area includes an insulating layer and a conductor formed sequentially over the surface of the semiconductor substrate, and a first impurity layer of a first conductivity type and a second impurity layer of a second conductively type formed sequentially under the surface of the semiconductor substrate. A barrier area is located adjacent the horizontal transfer area and spaced from the field insulating area. The barrier area includes the insulating layer and the conductor extending from the horizontal transfer area over the surface of the semiconductor substrate, a barrier area of the second conductivity type formed under the surface of the semiconductor substrate and adjacent the first impurity layer of the horizontal transfer area, and the second impurity layer extending from the horizontal transfer area and formed under the barrier area. A discharge area is located between the barrier area and the field insulating area. The discharge area includes a field insulating layer interposed between the insulating layer and the conductor extending from the barrier area over the surface of the semiconductor substrate, and a discharge layer of the first conductivity type formed under the surface of the semiconductor substrate and adjacent the barrier layer of the barrier area. An impurity concentration of the discharge layer is greater than that of the first impurity layer.

According to another aspect of the present invention, there is provided a method forming an interface between a horizontal charge transfer stage and an field insulating area of a solid state imaging device formed on a semiconductor substrate. The semiconductor substrate is selectively doped with impurities of a second conductivity type to form a lower structure having a field insulating area defined on a surface thereof. A discharge layer is formed in a discharge area of the lower structure which is adjacent to the field insulating area by doping with impurities of a first conductivity type at a first concentration. A field insulating layer is formed over the field insulation area of the surface of the lower structure. A barrier layer is formed in a barrier area of the lower structure which is adjacent to the discharge area by doping with impurities of the second conductivity type. The discharge area is interposed between the barrier area and the field insulating area. An impurity layer is formed in a horizontal charge transfer area of the lower structure which is adjacent to the barrier area by doping with impurities of the first conductivity type at a second concentration which is lower than the first concentration. The barrier area is interposed between the horizontal charge transfer area and the discharge area.

BRIEF DESCRIPTION OF THE DRAWINGS

The above and other objects and advantages of the present invention will become more readily apparent from the detailed description that follows, with reference to the accompanying drawings, in which.

DESCRIPTION OF THE PREFERRED EMBODIMENT

Figure 7A:
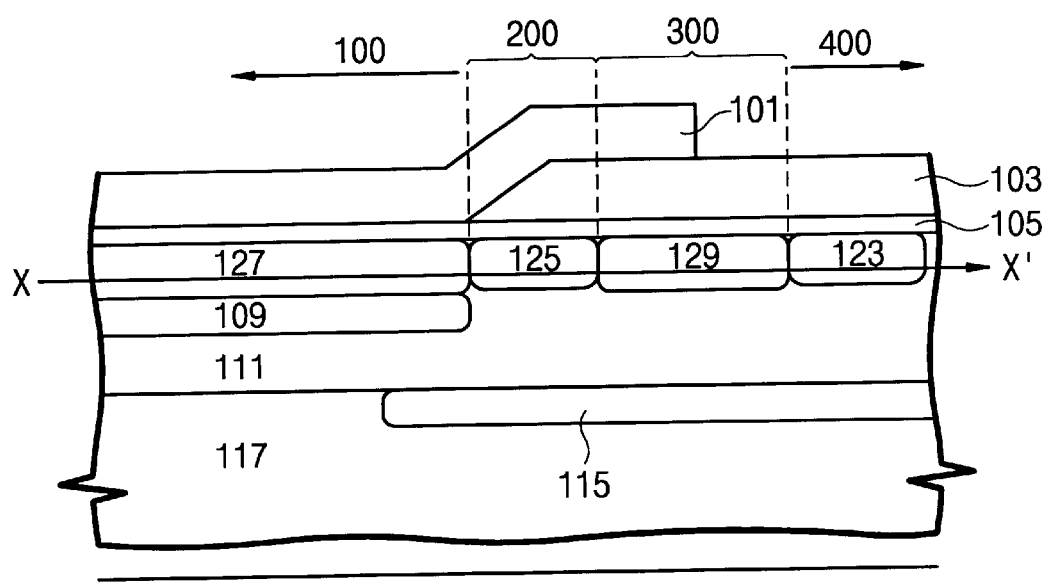
FIG. 7A is a cross-sectional view showing a horizontal transfer area and an adjacent field insulation part which is perpendicular to a charge proceeding direction of a horizontal transfer stage in accordance with the present invention.
Figure 8A:
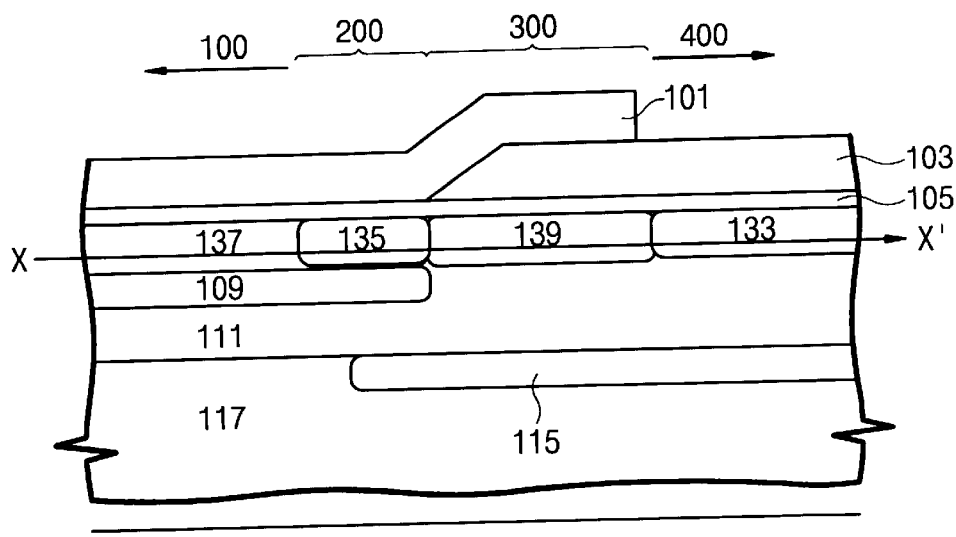
FIG. 8A is a cross-sectional view showing a horizontal transfer area and an adjacent field insulation part which is perpendicular to a charge proceeding direction of a horizontal transfer stage in accordance with a preferred embodiment of the present invention.

With reference to attached drawings in which like elements are designated by like reference numbers, a comparative example and the present invention will now be described. A layered structure of each area of the comparative example is shown in FIG. 7A, and the layered structure of each area of the present invention is shown in FIG. 8A. When compared with FIG. 7A, the configuration of FIG. 8A is characterized by the impurity doping layers over a surface layer of a semiconductor substrate being moved toward a field insulation part.

Figure 7B:
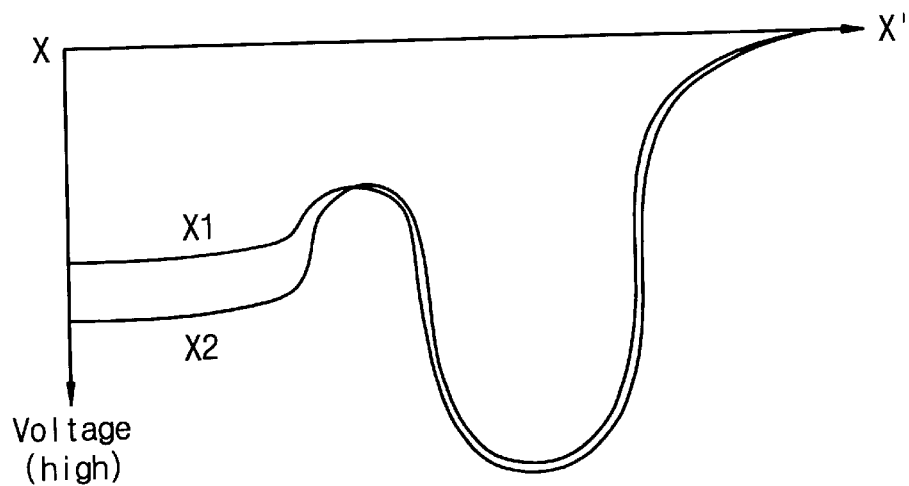
FIG. 7B is a graph showing a potential variation taken along a line X—X' of FIG. 7A.

Referring first to FIG. 7A, a potential barrier layer 125 is a substrate surface layer of a barrier part 200 doped with low concentration P-type impurity, and is formed under a thick field insulating layer 103. As can be seen in FIG. 7B, a potential of the barrier layer is constantly maintained irrespective of a voltage applied to a gate electrode. The potential is mainly determined by an impurity doping concentration when it operates in a solid state imaging device.

Since a potential difference between a horizontal transfer area 100 and the barrier part 200 is mainly determined by an impurity concentration of the surface layer of the semiconductor substrate, control of the concentration must be accurate to achieve appropriate functioning of the barrier part 200. Unfortunately, the accurate control of the impurity doping concentration causes a decrease in the process margin.

If the potential of the barrier layer 125 in the barrier part 200 is too high, electrons which represent a zoom picture or a picture of a normal mode can easily be discharged through a potential barrier layer of a heightened barrier layer 200 in a low-voltage applied part out of a horizontal transfer area 100. Therefore, a resultant picture becomes dark or distorted.

Figure 7C:
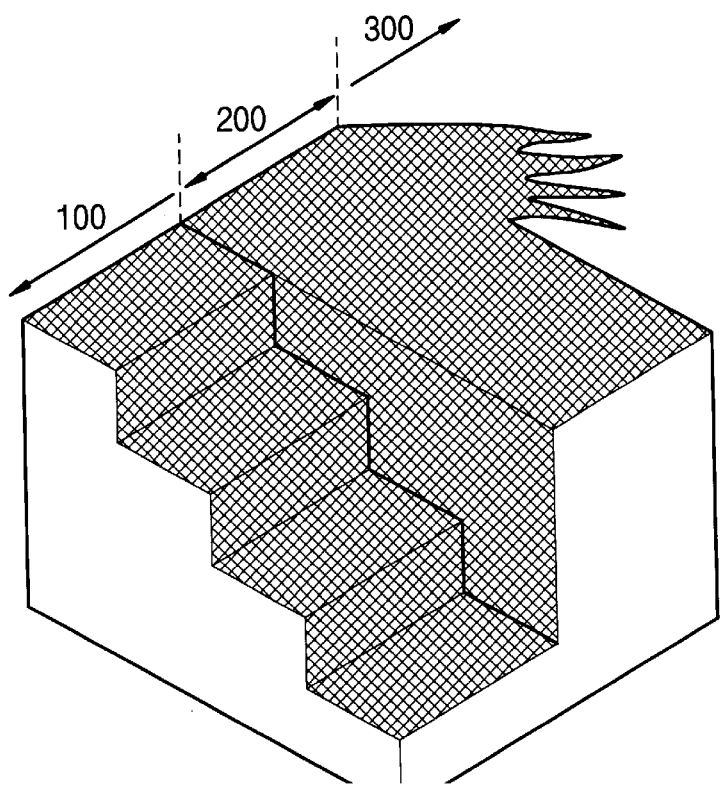
FIG. 7C is a conceptual view showing a potential construction of a horizontal transfer stage, a barrier part, and a discharge part in accordance with a comparative example of the present invention.

If a voltage of a gate electrode is boosted, a potential of a horizontal transfer stage becomes high in a part where a high voltage is applied to the gate electrode so as to transfer electrons of the horizontal transfer area 100. A potential of the barrier part 200 being a discharge standard is constantly retained, and a potential barrier extends. Thus, electrons corresponding to a picture area to be discarded for an electronic zoom mode are not sufficiently discharged in a horizontal transfer stage. FIG. 7C is a conceptual view for understanding of FIG. 7B, wherein it is considered that the lower steps are, the higher are their potential states.

In the example of FIG. 7A, an impurity doping concentration is to determine a level of the potential barrier that is a standard of discharging electrons in the horizontal transfer stage to a discharge part. The potential barrier between the horizontal barrier stage and the barrier part becomes relatively high in a part to which a high voltage is applied through a gate electrode. This make is difficult to sufficiently discharge the electrons in the horizontal barrier stage.

Turning now to FIG. 8A, a barrier part 200 is intervened between a horizontal transfer area 100 and a field insulation part 400, and a discharge part 300 is formed from the barrier part 200 towards the field insulation part 400. A layered structure of the horizontal transfer area 100 is similar to that of a conventional solid stage imaging device shown in FIG. 4A. In other words, a conductive layer which composes a gate electrode 101 is formed over a thin gate insulating layer 105 of a surface of the semiconductor substrate. The gate electrode 101 serves to apply clock signals of, for example, 0V and 3.3V. A horizontal transfer stage 137 doped with N-type impurities is formed at a substrate surface layer under the gate insulating layer 105, so that a main charge carrier is to be electrons. Under the horizontal transfer stage 137, layers 109 and 111 doped with P-type impurities are formed to suppress leakage of electrons that flow into the horizontal transfer stage 137.

The barrier part 200 is formed at an interface of the horizontal transfer area 100. Comparing the barrier part 200 with the horizontal transfer area 100, a difference resides in an impurity doping type at the surface layer of a semiconductor substrate 117. An impurity type of the surface layer of the semiconductor substrate 117 in the barrier part 200 is opposite to a type of impurities doped to a surface layer (i.e., horizontal transfer stage 137) of the semiconductor substrate 117 in the horizontal transfer area 100. In the preferred embodiment, the impurities in the barrier part 200 are P-type impurities. An impurity doping concentration is determined by a level of a front barrier layer 135 for discharging electrons condensed in the horizontal transfer stage 137 to a drain layer 139 of a discharge part, and is preferably low. The horizontal transfer area 100 and the barrier part 200 are doped with N-type impurities and the barrier part 200 is additionally doped with the P-type impurities, forming the P-type impurity doping layer (i.e., front barrier layer 135) of the substrate layer of the barrier part 200. If the barrier part 200 is protected by a mask when N-type impurities are implanted into the horizontal transfer stage 137, a potential area which is relatively lower than the stage 137 or the drain layer 139 of the drain part 300 may be formed. If the barrier 200 is very lightly doped with N-type impurities as the stage 137 when the mask is removed, the potential area 300 may also be formed.

Figure 8B:
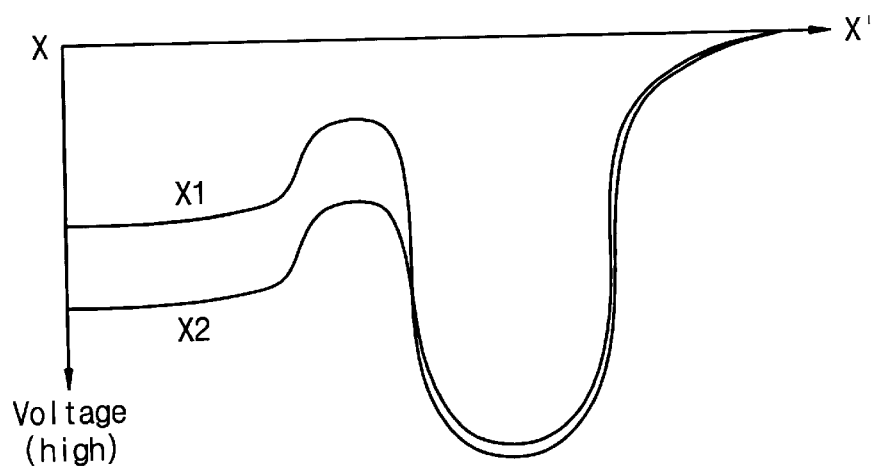
FIG. 8B is a graph showing a potential variation taken along a line X—X' of FIG. 8A.

As shown in FIG. 8B, a barrier part is influenced by a potential that is applied to a gate electrode there over. Within a similar potential difference, a potential of the barrier part and a horizontal transfer part is linked with that of the gate electrode. If electrons set to an electronic zoom mode are created in areas beyond a zoom area and quickly transferred to the horizontal transfer part, they are accumulated to lower an effective potential of the stage. If the decrease in the effective potential is greater than a potential difference (i.e., a size of a potential barrier) between the barrier and the horizontal transfer stage, partial electrons in the stage pass a potential barrier and continuously overflow to a discharge part.

Figure 8C:
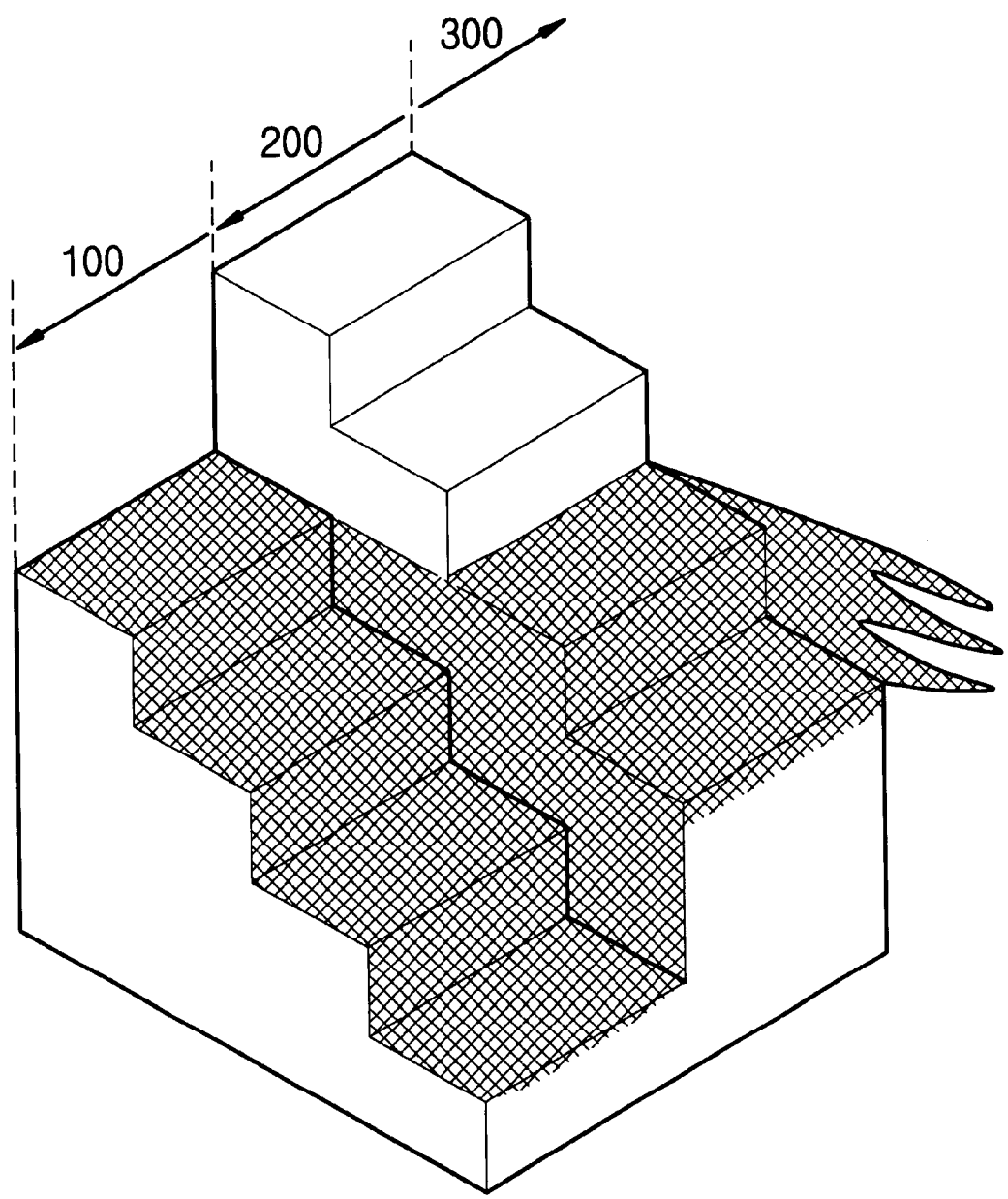
FIG. 8C is a conceptual view showing a potential construction of a horizontal transfer stage, a barrier part, and a discharge part in accordance with a comparative example of the present invention.

A state of electronic overflow is shown in FIG. 8C. Although a potential of a barrier part 200 is partially lower than an effective potential of a horizontal transfer area 100, the potential of the barrier part 200 can become high in a part to which a high voltage is applied. Thus, electrons in a horizontal transfer stage 137 can overflow through the part. Compared with the comparative example in which a complete potential of the barrier part 200 is constant, an electronic discharge efficiency of the stage 137 is enhanced.

A discharge part 300 is connected to the horizontal transfer stage 137 through the barrier part 200. On the basis of a conventional solid state imaging device, the discharge part 300 is made to be parallel with the horizontal transfer stage 137 aside of a field insulation part 400. Preferably, the discharge part 300 is formed at a part where it can be covered with a field insulating layer 103. A thick field insulating layer is intervened to clear the interaction with a gate electrode 101. Further, since a separate space is not required, a spatial availability can be enhanced. An adverse effect on an adjacent conductive layer or a semiconductor layer and a possibility of electric leakage can be prevented.

In the discharge part 300, a surface layer (i.e., drain layer 139) of the substrate 117 is doped with N-type impurities of high concentration. That is, the surface layer is doped with the impurities of the same conductivity type as the horizontal transfer stage. A P-type impurity layer is formed under the N-type impurity layer of high concentration, and is usually divided into a P-type well 111 and a peripheral well 115 there beneath. Forming the drain layer 139 of the high concentration doping layer leads to sufficient enhancement of a potential, enabling electrons to smoothly discharge at the horizontal transfer stage 137. The enhanced conductivity of the drain layer 139 acts as a good conductor that can easily transfer inflow electrons to an amplifier circuit unit. Therefore, a large amount of electrons can flow into the drain layer 139 of the discharge part 300 from the horizontal transfer stage 137. Since the drain layer 139 acts as a conductor, the inflow electrons easily discharge to a circuit to which a relatively higher voltage Vdd is applied. Therefore, when a large amount of electrons flowing into the horizontal transfer stage by an electronic zoom function overflow to the discharge part 300, the discharge part 300 can easily process the large amount of the electrons.

One example of a method of forming a solid state imaging device will now be described hereinafter with reference to FIG. 9A through FIG. 9E.

Figure 9A:
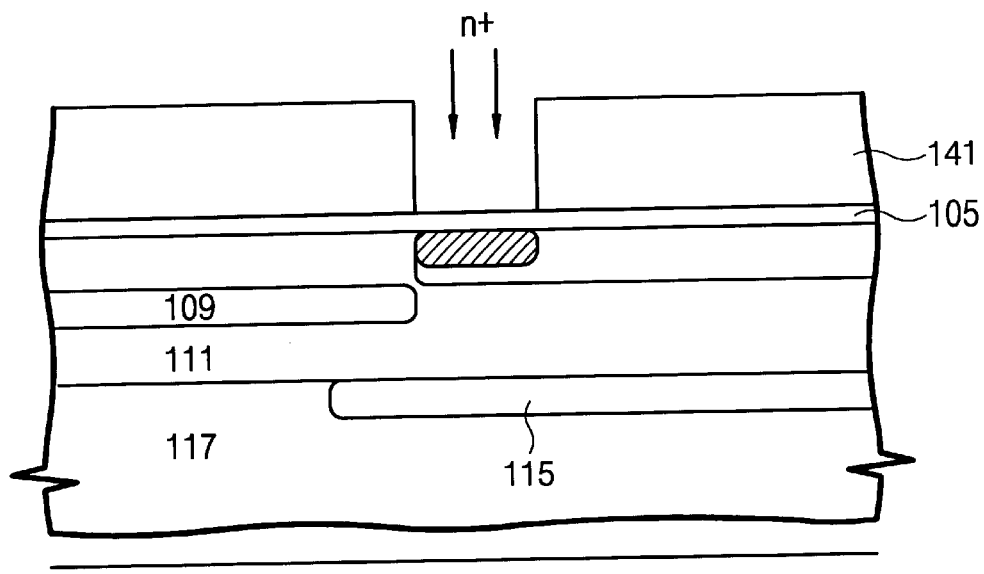
FIG. 9A through FIG. 9E are flow diagrams showing the steps of forming a solid state imaging device in accordance with the preferred embodiment of the present invention.

Referring to FIG. 9A, a thin gate insulating layer 105 is formed over a surface of a semiconductor substrate 117. A P-type well 111, a P-type impurity doping layer 109, and a peripheral well 115 are formed as shown using conventional ion implantation techniques, thereby obtaining a lower. Generally, a horizontal charge stop layer 133 is also formed at this time. An impurity implantation amount (dosage amount) for forming each impurity layer composing the lower structure is approximately $10^{12}$ particles/cm$^2$.

Then, photoresist patterning of an implantation mask 141, a drain layer 139 of a relatively high N-type impurity concentration is formed on in the surface layer of the semiconductor substrate 117 at an area between the field insulating region and the horizontal transfer stage. In this case, an impurity amount (dosage amount) is a relatively larger amount of approximately $1\times10^{13}$~$5\times10^{15}$ particles/cm$^2$.

Figure 9B:
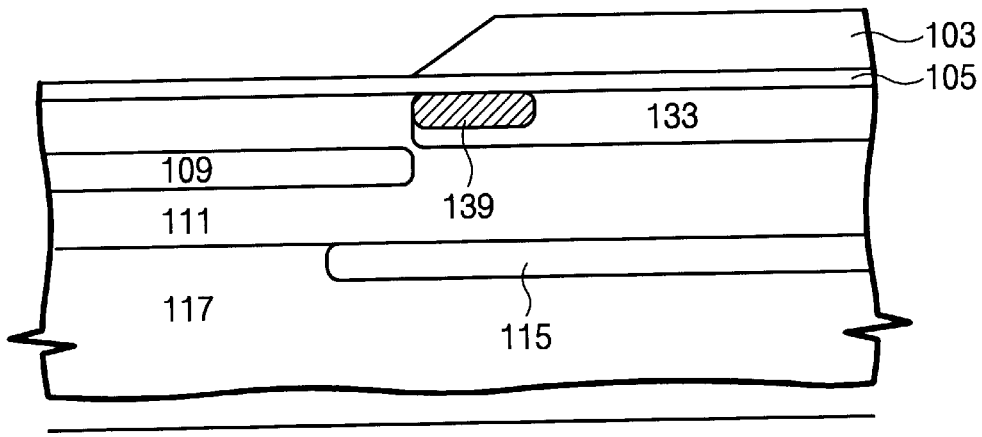

Referring to FIG. 9B, after forming a drain layer 139, a field insulating layer is formed over an entire surface thereof. Using conventional patterning techniques, a field insulating layer 103 remains only at a field insulation part and a discharge part. Here, a wet etch is usually applied. The field insulating layer 103 has a constant tilt angle at one end thereof An active area is defined as being an area where the field insulating layer 103 has been removed.

Figure 9C:
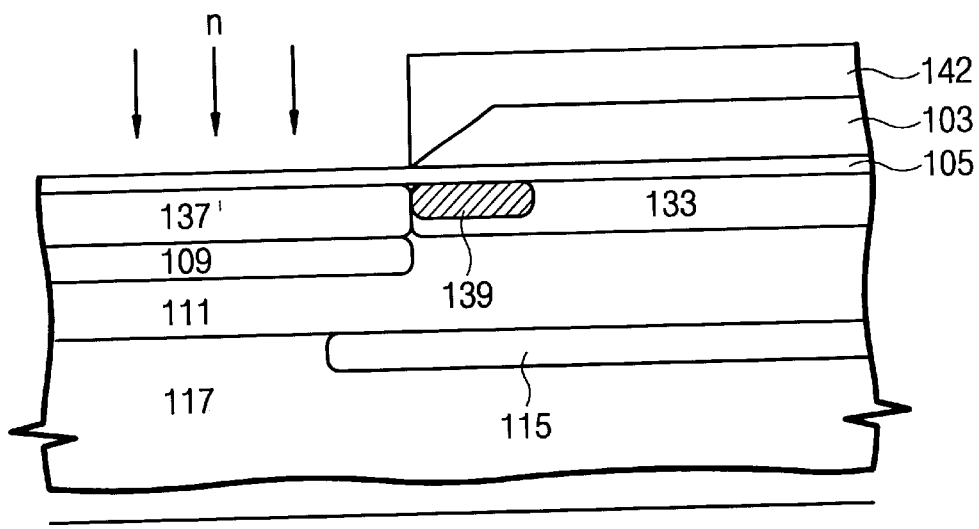

Referring to FIG. 9C, a selective ion implantation is performed to a surface layer of a transfer stage such as a horizontal transfer stage 137' with impurities which are the same as those of the drain layer 139 (in the preferred embodiment, N-type impurities). A photoresist pattern 142 covering the field insulating layer 103 is formed, usually being used as an ion implantation mask. In a preliminary horizontal transfer stage 137', N-type ionized impurities are implanted around a drain layer 139 that is covered with the field insulating layer 103. A dosage amount of the impurities is $3\times10^{12}$~$5\times10^{2}$ particles/cm$^2$.

Figure 9D:
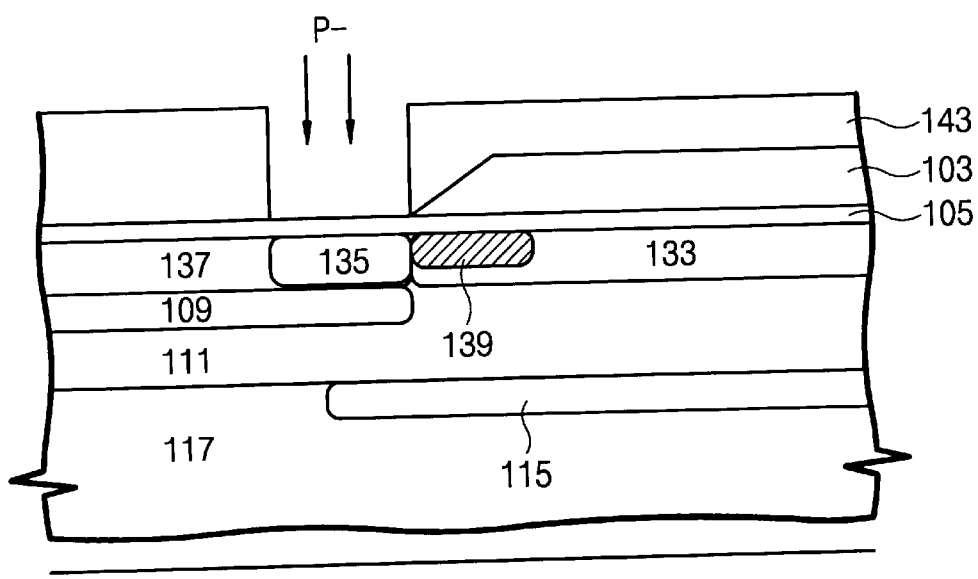

Referring to FIG. 9D, using the photoresist pattern 143 as a mask, impurities of relatively low concentration and opposite in electrical type to a drain layer 139 are implanted into a barrier region of the active region that is close to the drain layer 139. That is, P-type impurities are implanted into the barrier part of the surface layer of the semiconductor substrate. A dosage amount of the P-type impurities is $3\times10^{11}$~$6\times10^{11}$ particles/cm$^2$ which is a relatively lower concentration, which forms potential barrier 135 against the horizontal transfer stage 137.

The processes of FIG. 9C and FIG. 9D can be modified as follows. In the process of FIG. 9C, N-type impurities may be implanted only into a transfer stage part such as a horizontal transfer stage that is exposed by an ion implantation mask. In the process of FIG. 9D, N or P-type impurities of a low concentration may be implanted into a surface layer of a semiconductor substrate by exposing only a barrier part using the ion implantation mask. It is, however, difficult to control a doping concentration so that only N-type impurities are doped to form a suitable potential barrier.

Figure 9E:
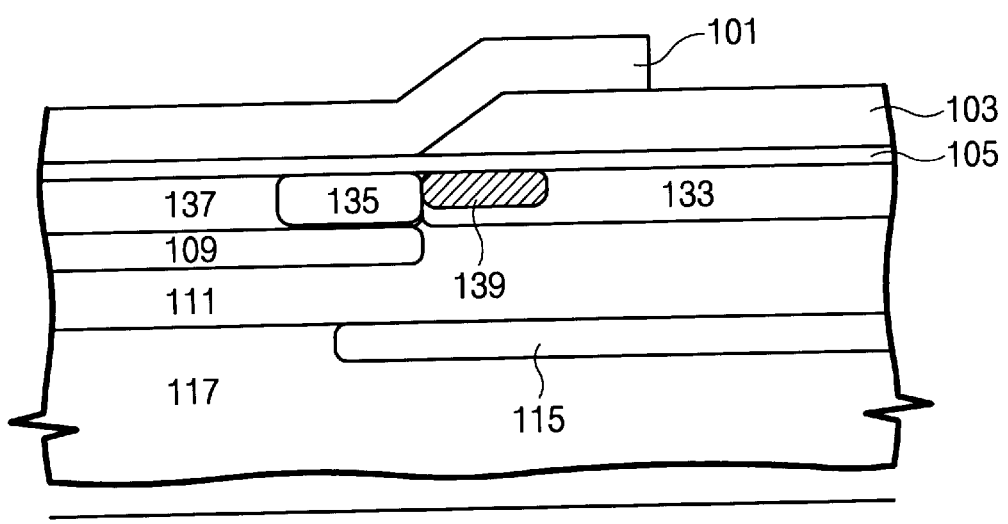

Referring to FIG. 9E, a semiconductor substrate is doped with impurities to form a gate electrode 101 of polysilicon over a gate insulation layer 105 and a field insulating layer 103. According to the present embodiment, the gate electrodes 101 are divided into two groups. A thin insulating layer is formed between the two groups. Impurities of low concentration (a dosage amount of $2\times10^{11}$~$4\times10^{11}$ particles/cm$^2$) are implanted into a firstly formed group of the gate electrodes 101, forming a poly-phase potential that can induce electrons from a horizontal transfer stage 137 to an amplifier circuitry.

Generally, a P-type well of a semiconductor substrate is fully formed in the initial step of forming a solid state imaging device. Under the P-type well, a peripheral P-type well is formed downwardly toward a field insulating layer. Therefore, the semiconductor substrate ordinarily uses an N-type substrate that is not doped or very lightly doped.

According to the present invention, a potential difference between all the parts of a horizontal transfer stage and a surface layer of a semiconductor substrate in a barrier layer is proportionally maintained at a constant amount that is determined by a difference of an impurity doping concentration. A part of a high potential is applied to each portion of a horizontal transfer stage, based on a method of stacking and arranging gate electrodes. Accordingly, a part of a high absolute potential is produced at a surface layer of the semiconductor substrate. Although a potential barrier between the horizontal transfer stage and a barrier part is more or less variable, electrons can sufficiently discharge to a drain layer of a discharge part because of their leakage through the high potential part. The variable potential barrier varies an impurity doping concentration of the barrier part, and implies that an electron discharge function is fully exerted with a sufficient margin during the impurity doping step. Upon one experiment on a solid state imaging device according to the present invention, an electronic zooming function can be realized without a blooming phenomenon even though a surface layer of the barrier part is varied in a P-type impurity doping concentration by 50%.

The larger the inflow of electrons to a horizontal transfer stage, the speedier the drop in an effective potential resulting from condensed electrons. Further, the greater the drop in the effective potential, the higher the speed of discharging electrons through a potential barrier part. Thus, the inflow electrons can rapidly discharge to the horizontal transfer stage.

The electrons condensed in the horizontal transfer stage will easily discharge to a part where a high voltage is applied by a gate electrode. The above-mentioned fact implies that it is possible to sufficiently decrease an amount of electrons that are not discharged by a potential difference between the barrier part and the horizontal transfer part to the last after a gate driving voltage is sufficiently applied. The non-discharge electrons can sufficiently discharge during a one or two reset step prior to a screen transfer step, by which a blooming phenomenon does not occur when images of a zoom area are displayed in a display apparatus.

Figure 1:
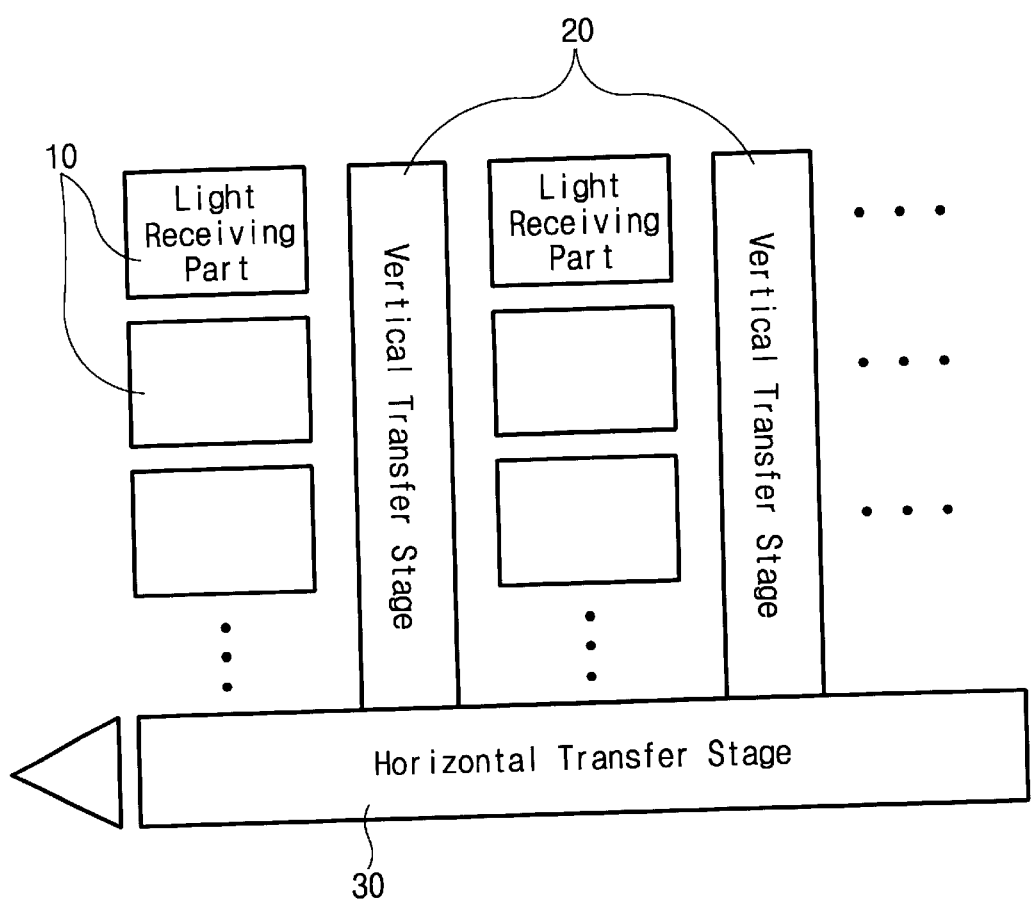
FIG. 1 is a top conceptual view showing the basic structure of a solid state imaging device.
Figure 2:
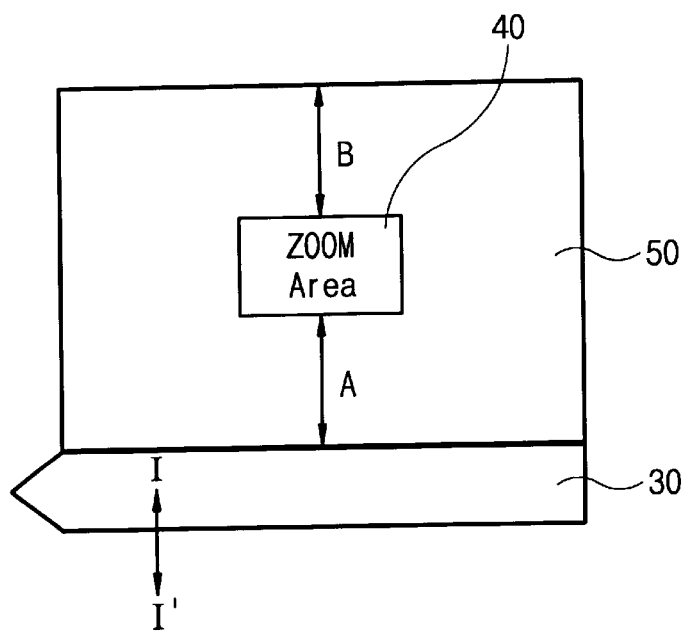
FIG. 2 is a conceptual view for explaining an electronic zooming function.
Figure 3:
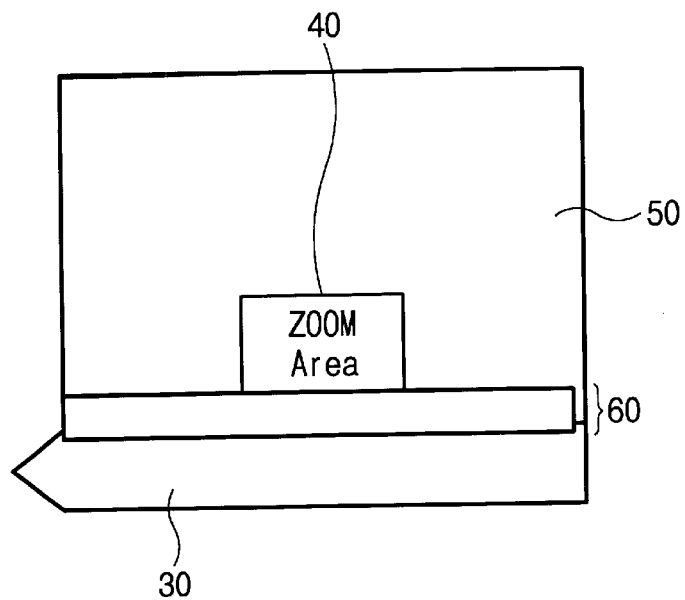
FIG. 3 is a conceptual view for explaining a blooming phenomenon.
Figure 4A:
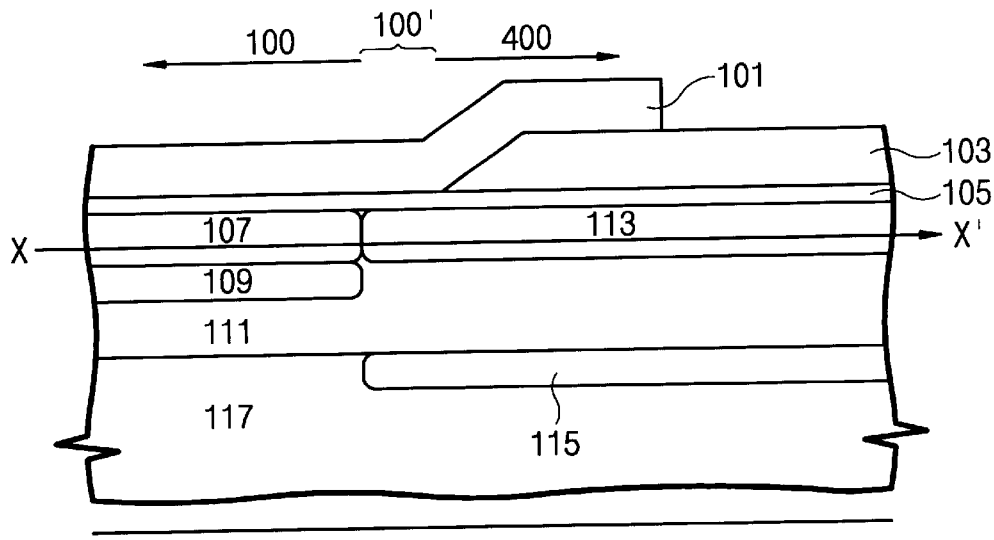
FIG. 4A is a cross-sectional view of a horizontal transfer area and an adjacent field insulation part along a line I—I of FIG. 2.
Figure 4B:
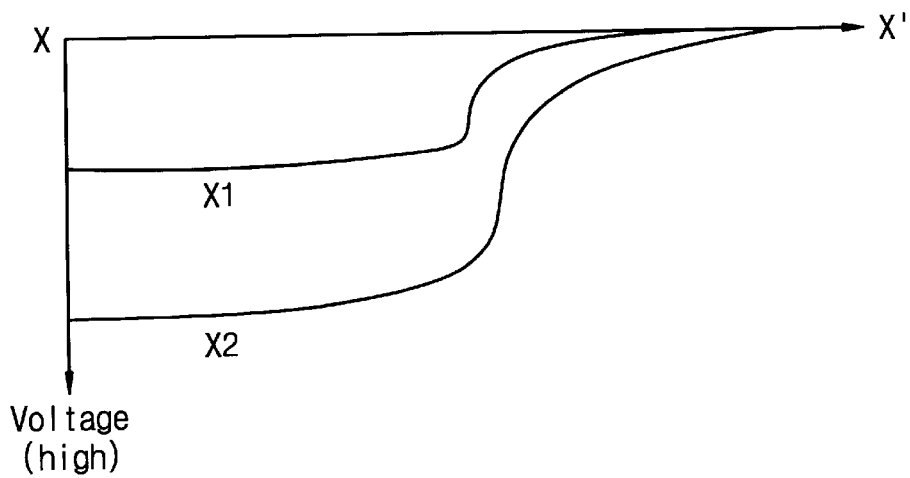
FIG. 4B is a graph showing a potential variation taken along a line X—X' of FIG. 4A.
Figure 4C:
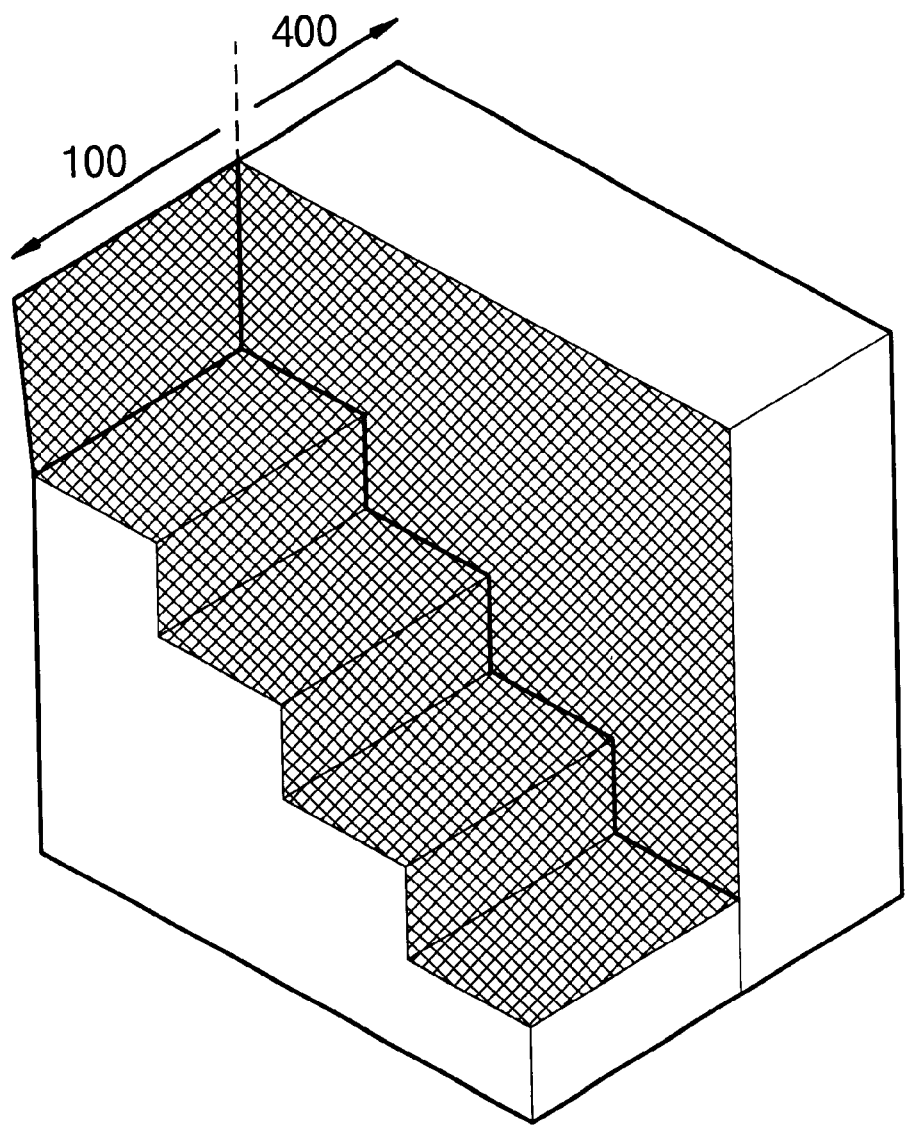
FIG. 4C is a conceptual view showing a potential construction of a horizontal transfer stage and a field insulation part.
Figure 5A:
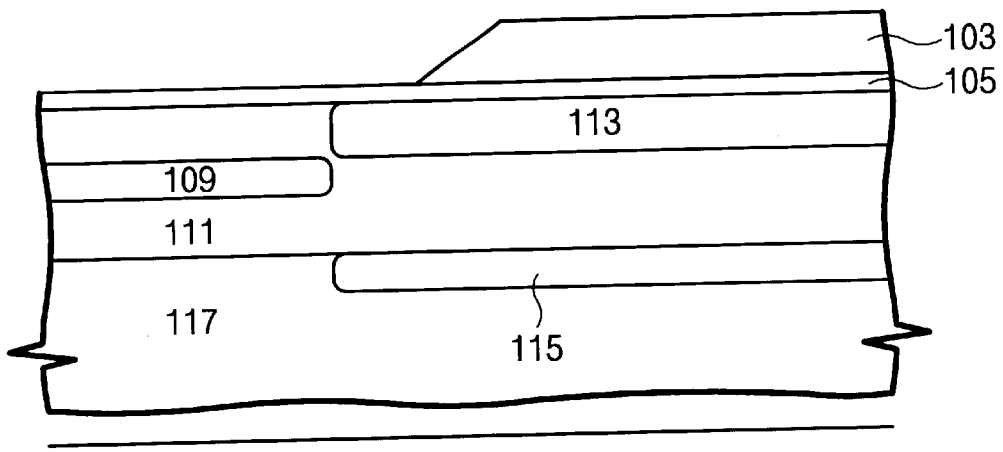
FIG. 5A through FIG. 5C are flow diagrams showing the steps of forming a solid state imaging device similar to that of FIG. 4A.
Figure 5B:
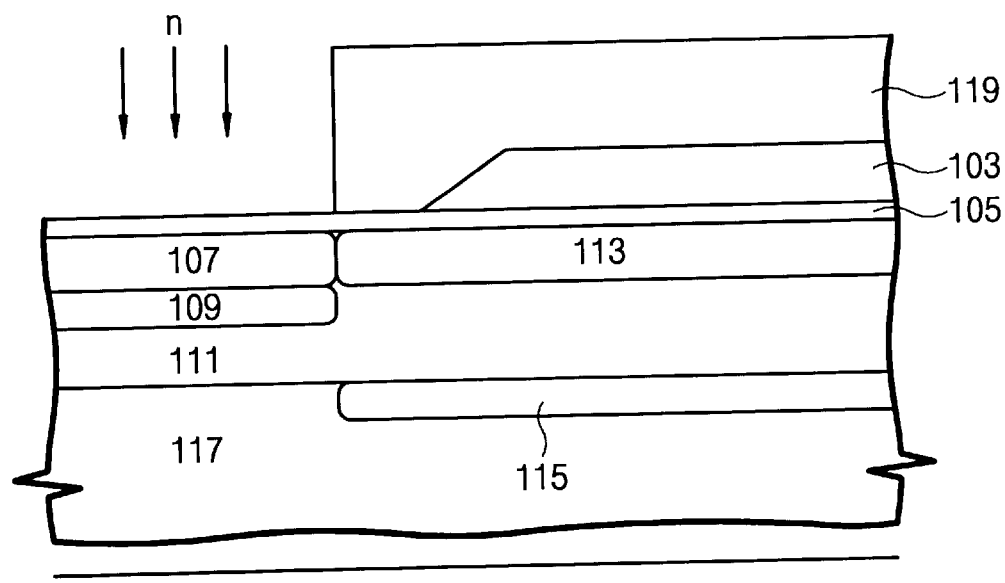
Figure 5C:
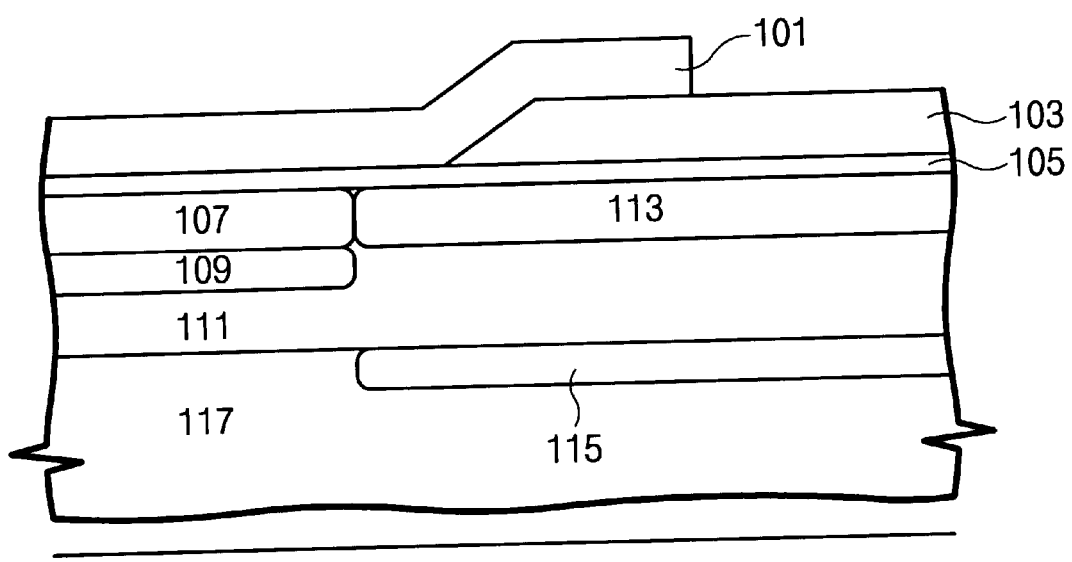
Figure 6:
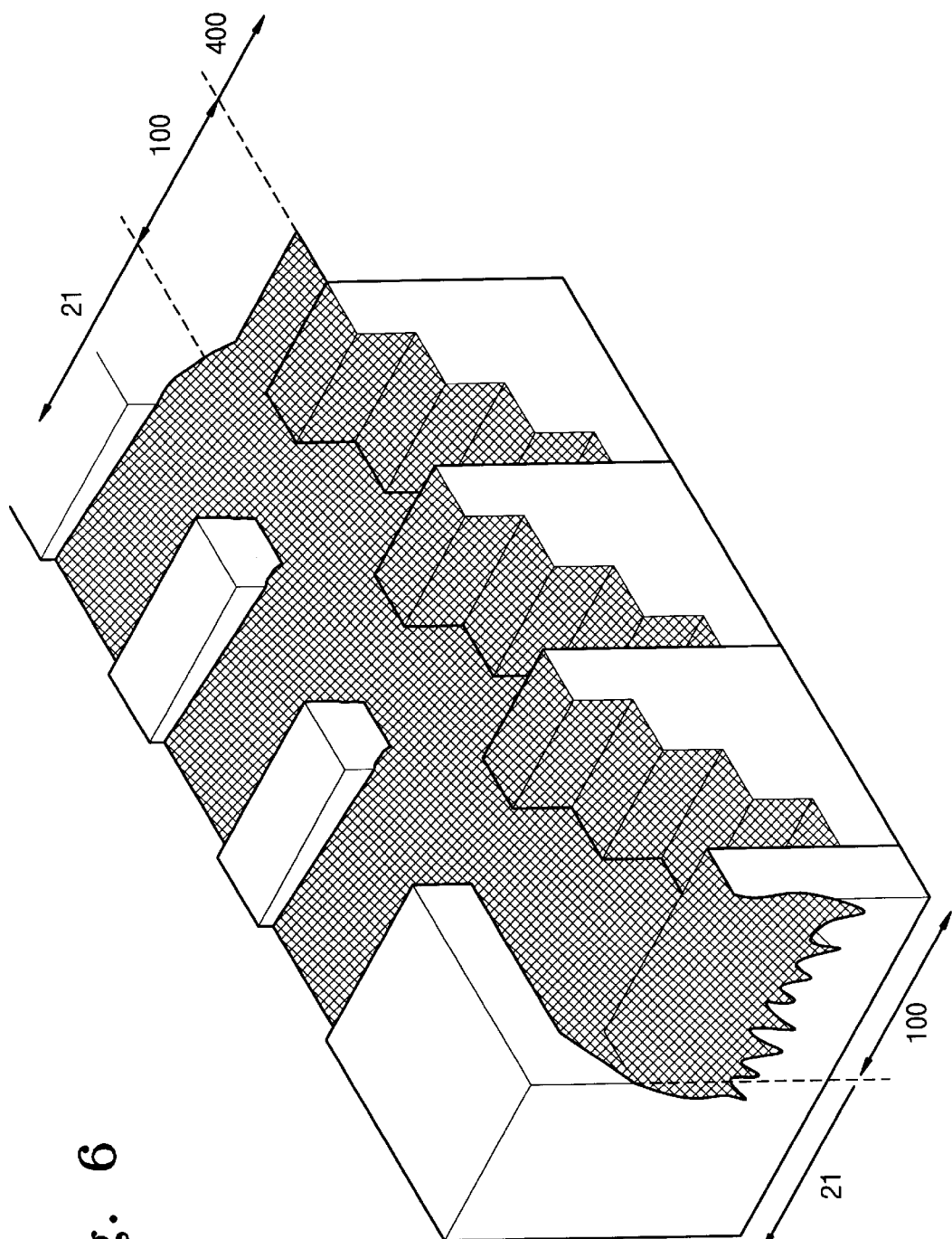
FIG. 6 is a conceptive view showing a potential construction of a part for connecting a vertical transfer stage to a horizontal transfer stage.
Figure 10A:
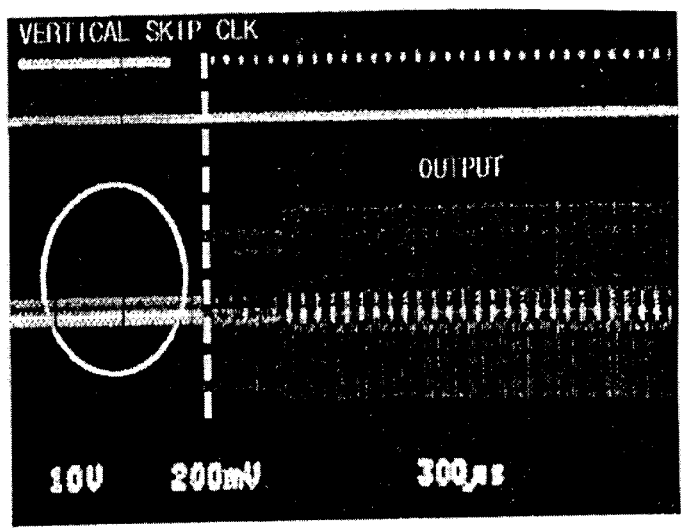
FIG. 10A is a photograph showing a type of a picture signal obtained from a solid state imaging device in accordance with a prior art.
Figure 10B:
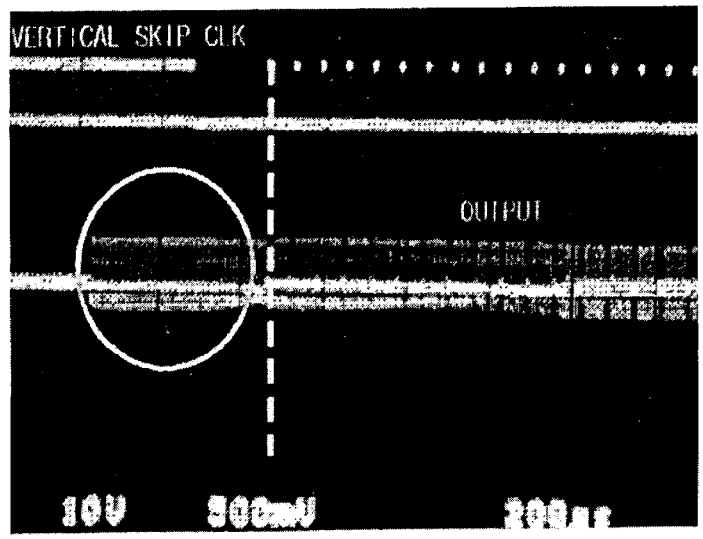
FIG. 10B is a photograph showing a type of a picture signal obtained from a solid state imaging device in accordance with the present invention.

FIG. 10A and FIG. 10B are photographs showing a measured result of signals that are transferred for composing images in an electronic zoom mode using a solid stage imaging device having a construction of FIG. 4A and FIG. 8A, respectively. The image signals are not transferred to a display in an interval where a fast clock signal (i.e., skip signal) for an electronic zooming function is applied.

As illustrated by the circle of FIG. 10A, an output signal is present in the interval prior to an output signal transfer time illustrated by a vertical dotted line. The output signal is not transferred to a display. However, an output signal of a constant interval on the left hand of the vertical dotted line has an influence upon an output signal transferred to a display after the output time, resulting in a blooming phenomenon.

With reference to FIG. 10B, an output signal is not present in an interval prior to an output signal transfer time. Since there is no element having an influence upon an output signal after an output time, a zoom screen can be watched without encountering difficult elements.

While an illustrative embodiment of the present invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

What is claimed is:

1. A charge-coupled-device (CCD) solid state imaging device, comprising:

a semiconductor substrate having a surface defined by an active area and a field insulating area;

a plurality of light receiving parts arranged in a matrix of rows and columns within the active area of the surface of the semiconductor substrate;

a plurality of vertical charge transfer stages which extend parallel to each other in a column direction and which are connected to adjacent respective columns of the plurality of light receiving parts;

a horizontal charge transfer stage commonly connected to ends of the plurality of vertical transfer stages and formed in a horizontal transfer area, wherein the horizontal transfer area includes an insulating layer and a conductor formed sequentially over the surface of the semiconductor substrate, and a first impurity layer of a first conductivity type and a second impurity layer of a second conductively type formed sequentially under the surface of the semiconductor substrate;

a barrier area located adjacent the horizontal transfer area and spaced from the field insulating area, wherein the barrier area includes the insulating layer and the conductor extending from the horizontal transfer area over the surface of the semiconductor substrate, a barrier area of the second conductivity type formed under the surface of the semiconductor substrate and adjacent the first impurity layer of the horizontal transfer area, and the second impurity layer extending from the horizontal transfer area and formed under the barrier area; and a discharge area located between the barrier area and the field insulating area, wherein the discharge area includes a field insulating layer interposed between the insulating layer and the conductor extending from the barrier area over the surface of the semiconductor substrate, and a discharge layer of the first conductivity type formed under the surface of the semiconductor substrate and adjacent the barrier area of the barrier area over the surface layer, and wherein an impurity concentration of the discharge layer is greater than that of the first impurity layer.

2. The device as claimed in claim 1, wherein the first conductivity type is N-type conductivity, and the second conductivity type is P-type conductivity.

3. The device as claimed in claim 1, wherein impurity concentrations of the barrier layer and the first impurity layer are such that a potential difference between the barrier layer and the first impurity layer in the absence of an applied electric potential is lower than a maximum voltage applied through the conductor.

4. The device as claimed in claim 3, wherein the potential difference is 1V to 2.5V.

5. The device as claimed in claim 4, wherein the field insulating layer is thicker than the insulating layer in the discharge area.

6. The device as claimed in claim 1, wherein the conductor is divided into two parts of a predetermined width in the horizontal charge transfer stage relative to a charge migration direction, and a stepped potential is periodically applied to the conductor based on an external clock signal.

* * * * *